US009037443B1

(12) United States Patent  
Meyer et al.

(10) Patent No.: US 9,037,443 B1
(45) Date of Patent: May 19, 2015

(54) SYSTEMS AND METHODS FOR SOLAR POWER EQUIPMENT

(71) Applicant: Alpha Technologies, Inc., Bellingham, WA (US)

(72) Inventors: John R. Meyer, Bellingham, WA (US); Gordon H. Petroski, North Delta (CA)

(73) Assignee: Alpha Technologies Inc., Bellingham, WA (US)

( * ) Notice: Subject to any disclaimer, the term of this patent is extended or adjusted under 35 U.S.C. 154(b) by 307 days.

(21) Appl. No.: 13/653,359

(22) Filed: Oct. 16, 2012

Related U.S. Application Data

(60) Provisional application No. 61/547,727, filed on Oct. 16, 2011.

(51) Int. Cl.
*G06G 7/48* (2006.01)
*F03G 6/00* (2006.01)
*H01L 31/046* (2014.01)

(52) U.S. Cl.
CPC ............... *F03G 6/001* (2013.01); *H01L 31/046* (2014.12)

(58) Field of Classification Search
CPC ............ B01D 35/26; B60P 3/06; F03G 6/00; F03G 6/001; F24J 2/50; G01K 13/00; G05F 3/02; G05F 1/67; G06F 15/00; G06F 17/50; G06F 1/28; G06F 1/30; H01L 31/18; H01L 31/00; H01L 31/046; H02M 7/44; H01M 10/46; H02S 46/44
USPC ............ 703/6, 7; 363/95; 702/183; 60/641.8, 60/641.15; 320/101, 102; 307/166; 700/296; 62/157
See application file for complete search history.

(56) References Cited

U.S. PATENT DOCUMENTS

| 3,944,837 A | 3/1976 | Meyers et al. |
| 4,063,963 A | 12/1977 | Bond, Jr. |
| 4,262,209 A | 4/1981 | Berner |

(Continued)

FOREIGN PATENT DOCUMENTS

| AU | 9520294 | 12/1995 |
| CA | 1265231 | 1/1990 |

(Continued)

OTHER PUBLICATIONS

Boehringer, "Self-adapting dc Converter for Solar Spacecraft Power Supply," IEEE Transactions on Aerospace and Electronic Systems, vol. AES-4, No. 1, Jan. 1968, pp. 102-111.

(Continued)

*Primary Examiner* — Kandasamy Thangavelu
(74) *Attorney, Agent, or Firm* — Michael R. Schacht; Schacht Law Office, Inc.

(57) ABSTRACT

A design system for generating a power equipment proposal for a particular location, comprises an insolation database, a load database, and a processing system. The insolation database comprises insolation values associated with a plurality of geographic data points. The load database associates appropriate power equipment with load requirements. The processing system generates at least one power equipment proposal based on load requirements generated from the insolation database based on the insolation values associated with a geographic data point closest to the particular location and solar power equipment appropriately selected from the load database based on the load requirements generated from the insolation database.

20 Claims, 15 Drawing Sheets

(56) References Cited

U.S. PATENT DOCUMENTS

| | | | |
|---|---|---|---|
| 4,731,547 A | 3/1988 | Alenduff et al. | |
| 4,943,763 A | 7/1990 | Bobry | |
| 4,975,649 A | 12/1990 | Bobry | |
| 5,010,469 A | 4/1991 | Bobry | |
| 5,029,285 A | 7/1991 | Bobry | |
| 5,228,924 A | 7/1993 | Barker et al. | |
| 5,302,858 A | 4/1994 | Folts | |
| 5,400,005 A | 3/1995 | Bobry | |
| 5,410,720 A | 4/1995 | Osterman | |
| 5,457,377 A | 10/1995 | Jonsson | |
| 5,532,525 A | 7/1996 | Kaiser et al. | |
| 5,638,244 A | 6/1997 | Mekanik et al. | |
| 5,642,002 A | 6/1997 | Mekanik et al. | |
| 5,739,595 A | 4/1998 | Mekanik et al. | |
| 5,760,495 A | 6/1998 | Mekanik | |
| 5,856,712 A | 1/1999 | Suzuki et al. | |
| 5,892,431 A | 4/1999 | Osterman | |
| 5,949,662 A | 9/1999 | Boldin et al. | |
| 5,961,604 A | 10/1999 | Anderson et al. | |
| 5,982,645 A | 11/1999 | Levran et al. | |
| 5,994,793 A | 11/1999 | Bobry | |
| 6,014,015 A | 1/2000 | Thorne et al. | |
| 6,093,885 A | 7/2000 | Takehara et al. | |
| 6,198,177 B1 | 3/2001 | Mao et al. | |
| 6,201,371 B1 | 3/2001 | Kawabe et al. | |
| 6,288,916 B1 | 9/2001 | Liu et al. | |
| 6,348,782 B1 | 2/2002 | Oughton, Jr. et al. | |
| 6,483,730 B2 | 11/2002 | Johnson, Jr. | |
| 6,486,399 B1 | 11/2002 | Armstrong et al. | |
| 6,542,791 B1 | 4/2003 | Perez | |
| 6,602,627 B2 | 8/2003 | Liu et al. | |
| 6,605,879 B2 | 8/2003 | Wade et al. | |
| 6,841,971 B1 | 1/2005 | Spee et al. | |
| 6,933,626 B2 | 8/2005 | Oughton, Jr. | |
| 7,040,920 B2 | 5/2006 | Johnson, Jr. et al. | |
| 7,050,312 B2 | 5/2006 | Tracy et al. | |
| 7,182,632 B1 | 2/2007 | Johnson, Jr. et al. | |
| 7,449,798 B2 | 11/2008 | Suzuki et al. | |
| 7,746,669 B2 | 6/2010 | Falk | |
| RE43,572 E | 8/2012 | West | |
| 2003/0038610 A1* | 2/2003 | Munshi et al. | 320/101 |
| 2003/0047209 A1 | 3/2003 | Yanai et al. | |
| 2003/0117822 A1 | 6/2003 | Stamenic et al. | |
| 2007/0194759 A1 | 8/2007 | Shimizu et al. | |
| 2007/0199336 A1* | 8/2007 | Tantot | 62/157 |
| 2008/0197122 A1 | 8/2008 | Gober | |
| 2009/0194145 A1* | 8/2009 | Kribus et al. | 136/248 |
| 2010/0017045 A1* | 1/2010 | Nesler et al. | 700/296 |
| 2010/0109601 A1* | 5/2010 | Coyle et al. | 320/102 |
| 2010/0169008 A1* | 7/2010 | Niwa et al. | 701/208 |
| 2010/0279455 A1* | 11/2010 | Seemann | 438/73 |
| 2010/0318297 A1* | 12/2010 | Herzig et al. | 702/3 |
| 2011/0068624 A1 | 3/2011 | Dibachi et al. | |
| 2011/0100004 A1* | 5/2011 | Al-Mazeedi | 60/641.8 |
| 2011/0114079 A1* | 5/2011 | Heckendorn | 126/574 |
| 2011/0198932 A1 | 8/2011 | Le et al. | |
| 2011/0204720 A1* | 8/2011 | Ruiz et al. | 307/66 |
| 2011/0291608 A1* | 12/2011 | Shimura et al. | 320/101 |
| 2012/0158362 A1* | 6/2012 | Vandevelde et al. | 702/183 |
| 2012/0188806 A1* | 7/2012 | Tamura et al. | 363/95 |
| 2013/0081396 A1* | 4/2013 | Kuo | 60/641.8 |

FOREIGN PATENT DOCUMENTS

| | | |
|---|---|---|
| CA | 2033685 | 10/1991 |
| CA | 2036296 | 11/1991 |
| CA | 1297546 | 3/1992 |
| CA | 2086897 | 7/1993 |
| CA | 2028269 | 1/2000 |
| CA | 2149845 | 2/2000 |
| CA | 2403888 | 9/2001 |
| CA | 2168520 | 4/2003 |
| CA | 2504101 | 6/2005 |
| CA | 2713017 | 7/2009 |
| DE | 9302756.7 | 2/1993 |
| EP | 0827254 | 11/2005 |
| GB | 2355350 | 4/2001 |
| JP | 61165051 | 10/1986 |
| JP | 2000023365 | 1/2000 |
| JP | 2001190035 | 7/2001 |
| JP | 2004296547 | 10/2004 |
| JP | 3142899 | 7/2008 |
| KR | 2019990000402 | 1/1999 |
| KR | 1020070004478 | 1/2007 |
| KR | 1020070078524 | 8/2007 |
| WO | 2007129808 | 11/2007 |
| ZA | 0931273 | 2/1993 |

OTHER PUBLICATIONS

Enslin, Wolf, Snyman, Swiegers, "Integrated Photovoltaic Maximum Power Point Tracking Converter", IEEE Transactions on Industrial Electronics, vol. 44, No. 6, Dec. 1997, pp. 769-773.

Enslin, "Maximum Power Point Tracking: A Cost Saving Necessity in Solar Energy Systems" Renewable Energy vol. 2, No. 6, 1992, pp. 543-549.

Schoeman, Van Wyk, "A Simplified Maximal Power Controller for Terrestrial Photovoltaic Panel Arrays", 13th Annual IEEE Power Electronics Specialists Conference (PESC '82 Record), Jun. 1982, pp. 361-367, Cambridge, MA.

Snyman, Enslin, "An Experimental Evaluation of MPPT Converter Topologies for PV Installations", Renewable Energy, vol. 3, No. 8, 1993, pp. 841-848.

PCT International Search Report, International Application No. PCT/US2011/056597, Jan. 11, 2012, 12 pages.

PCT International Search Report, International Application No. PCT/US2009/031836, Aug. 18, 2009, 12 pages.

PCT International Search Report, International Application No. PCT/US2010/032832, Dec. 2, 2010, 10 pages.

* cited by examiner

STEP 2:
DEFINE LOAD
   INSTRUCTIONS: Please specify your load. Enter a short description, quantity, power consumed, and the hours per day that the sub-load will operated. You may also add other sub-loads to help keep the load organized. Don't forget to select the appropriate system voltage from the drop-down box.

| Description | Quantity | Watts | Hours/Day | Wh/Day | | 242 |
|---|---|---|---|---|---|---|
| Camera | 2 | 10 | 24 | 480 Wh | | ADD |
| 230a | 232a | 234a | 236a | 238a | | |

Total Daily Power Consumption
250 — 480 Wh

System Voltage* — 240
12V DC
252 — Maximum Hourly Power Consumption
20 W

System Load
20 W
256 — 254 — Average Power Consumption
20 W

258 — NEXT

*Please contact Supplier if you require multiple output voltages

STEP 2:
DEFINE LOAD
   INSTRUCTIONS: Please specify your load. Enter a short description, quantity, power consumed, and the hours per day that the sub-load will operated. You may also add other sub-loads to help keep the load organized. Don't forget to select the appropriate system voltage from the drop-down box.

| Description 230a | Quantity 232a | Watts 234a | Hours/Day 236a | Wh/Day 238a | 242 |
|---|---|---|---|---|---|
| Camera | 2 | 10 | 24 | 480 Wh | ADD |
| Description | Quantity | Watts 236b | Hours/Day | Wh/Day | |
| Lights | 2 | 50 | 12 | 1200 Wh | 238b |
| 230b | 232b | 234b | | | |

Total Daily Power Consumption
250 — 1680 Wh

System Voltage* — 240
12V DC
252 — Maximum Hourly Power Consumption
120 W

System Load
120 W
254 — Average Power Consumption
120 W
256

258 — NEXT

*Please contact Supplier if you require multiple output voltages

FIG. 4B

STEP 3:
SELECT SOLUTION

INSTRUCTIONS: Please select an OPS that fulfills your requirements. Simply click on the solution you would like pricing for and continue to Step 4. Hover your mouse over any term you are not familiar with to learn more about it. — 260

LOCATION OVERVIEW: — 270

NEAREST CITY: Bowdon, ND
AVERAGE INSOLATION: 2.17 — 272
MINIMUM INSOLATION: 1.73 — 274

— 262

System 12-390/800 — 280a                                Premium
Days of Autonomy:                    282a — 24 day(s)
Voltage:                             284a — 12 V DC
PV Array Size:                       286a — 390 W
Battery Bank Size:                   288a — 1680 Wh
PWM or MPPT                          290a — MPPT
Warranty                             292a — 5 year 264                                             266

System 12-320/530M     Standard        System 12160/158   282c  Economy
 280b        282b                       280c
Days of Autonomy: 13 day(s)            Days of Autonomy: 7 day(s)
            284b — 12 V DC                         284c
Voltage:                               Voltage:          12 V DC
        286b                                       286c
PV Array Size: 288b  320 W             PV Array Size: 288c  160 W
Battery Bank Size:  530 Ah             Battery Bank Size:  156 Ah
PWM or MPPT 290b  MPPT                 PWM or MPPT 290c  PWM
Warranty   292b — 2 year               Warranty   292c — 1 year Please select a solution.
                                              268 — NEXT

FIG. 5

STEP 4:
ENTER CONTACT INFORMATION  320

SOLUTION: PREMIUM

NAME: 322
Joe Customer

COMPANY: 324
ABC Security Systems, Inc.

ADDRESS: 326  326  326
1234 Main Street

CITY: 328    STATE: 330   ZIP CODE: 332
Bowdon       ND           58418

EMAIL: 334              PHONE: 336
joe@ABCSecurityBowdon.com   701 555 1234

338  NEXT

FIG. 6

STEP 5:
QUESTIONS/COMMENTS

SOLUTION: PREMIUM

QUESTIONS/COMMENTS  340
Please call and ask for Joe to discuss.

342  SUBMIT

FIG. 7

TO FIG. 9A uator-Pointed Tilted Surface (kWh/m²/day)

| Jul | Aug | Sep | Oct | Nov | Dec | Annual Average |
|---|---|---|---|---|---|---|
| 5.86 | 5.23 | 4.05 | 2.31 | 1.26 | 0.94 | 3.36 |
| 0.52 | 0.53 | 0.53 | 0.44 | 0.37 | 0.36 | 0.45 |
| 2.51 | 3.20 | 1.80 | 1.16 | 0.76 | 0.60 | 1.64 |
| 5.49 | 5.26 | 4.49 | 2.91 | 1.66 | 1.34 | 3.37 |
| 5.88 | 5.20 | 3.98 | 2.25 | 1.25 | 0.91 | 3.34 |
| 3.68 | 3.47 | 4.70 | 3.00 | 1.82 | 1.39 | 3.69 |
| 5.21 | 5.18 | 4.68 | 3.13 | 1.95 | 1.51 | 3.60 |
| 4.51 | 4.65 | 4.43 | 3.18 | 1.99 | 1.56 | 3.34 |
| 2.97 | 3.23 | 3.42 | 2.62 | 1.79 | 1.43 | 2.53 |
| 5.95 | 5.51 | 4.72 | 3.14 | 1.99 | 1.56 | 3.83 |
| 11.0 | 23.0 | 38.0 | 51.0 | 60.0 | 63.0 | 37.4 |

*alculated when the clearness index (K) is below 0.3 or above 0.8* r-pointed Tilted Surface (kWh/m²/day)

| Jul | Aug | Sep | Oct | Nov | Dec | Annual Average |
|---|---|---|---|---|---|---|
| 4.13 | 4.36 | 3.47 | 2.00 | 1.05 | 0.78 | 2.74 |
| 0.37 | 0.44 | 0.45 | 0.38 | 0.39 | 0.39 | 0.36 |
| 2.51 | 2.26 | 1.70 | 1.06 | 0.68 | 0.53 | 1.58 |
| 2.45 | 3.68 | 3.03 | 1.58 | 0.49 | 0.38 | 1.90 |
| 4.14 | 4.33 | 3.41 | 1.95 | 1.04 | 0.76 | 2.73 |
| 4.00 | 4.49 | 3.95 | 2.56 | 1.45 | 1.09 | 2.96 |
| 3.68 | 4.34 | 3.92 | 2.66 | 1.54 | 1.17 | 2.87 |
| 3.22 | 3.82 | 3.70 | 2.62 | 1.55 | 1.20 | 2.66 |
| 2.24 | 2.89 | 2.85 | 2.21 | 1.38 | 1.09 | 2.03 |
| 4.18 | 4.54 | 3.97 | 2.66 | 1.56 | 1.20 | 3.06 |
| 10.0 | 21.0 | 37.0 | 50.0 | 57.0 | 61.0 | 35.5 |

*alculated when the clearness index (K) is below 0.3 or above 0.8*

FIG. 9B

| System Specifications | | | | |
|---|---|---|---|---|
| SPS Model Number | Type | Voltage | PV Watts | Ah |
| SPS12-55/106 | PWM | 12 | 55 | 106 |
| SPS12-110/212 | PWM | 12 | 110 | 212 |
| SPS12-165/318 | PWM | 12 | 165 | 318 |
| SPS12-240/530 | PWM | 12 | 240 | 530 |
| SPS12-320/600M | MPPT | 12 | 320 | 600 |
| SPS12-390/795M | MPPT | 12 | 390 | 795 |
| SPS12-480/1060M | MPPT | 12 | 480 | 1060 |
| SPS24-165/212 | PWM | 24 | 165 | 212 |
| SPS24-330/400 | PWM | 24 | 330 | 400 |
| SPS24-495/530 | PWM | 24 | 495 | 530 |
| SPS24-660/795M | MPPT | 24 | 660 | 795 |
| SPS24-990/1060M | MPPT | 24 | 990 | 1060 |
| SPS24-1320/1325M | MPPT | 24 | 1320 | 1325 |
| SPS48-220/170M | MPPT | 48 | 220 | 170 |
| SPS48-330/200M | MPPT | 48 | 330 | 200 |
| SPS48-660/400M | MPPT | 48 | 660 | 400 |
| SPS48-990/600M | MPPT | 48 | 990 | 600 |
| SPS48-1320/795M | MPPT | 48 | 1320 | 795 |
| SPS48-1650/1060M | MPPT | 48 | 1650 | 1060 |
| SPS48-1980/1325M | MPPT | 48 | 1980 | 1325 |
| SPS Model Number | Type | Voltage | PV Watts | Ah |
| SPS12-55/78 | PWM | 12 | 55 | 78 |
| SPS12-110/156 | PWM | 12 | 110 | 156 |
| SPS12-165/212 | PWM | 12 | 165 | 212 |
| SPS12-240/318 | PWM | 12 | 240 | 318 |
| SPS12-320/530M | MPPT | 12 | 320 | 530 |
| SPS12-390/600M | MPPT | 12 | 390 | 600 |
| SPS12-480/800M | MPPT | 12 | 480 | 800 |
| SPS24-165/106 | PWM | 24 | 165 | 106 |
| SPS24-330/265 | PWM | 24 | 330 | 265 |
| SPS24-495/400 | PWM | 24 | 495 | 400 |
| SPS24-660/530M | MPPT | 24 | 660 | 530 |

| Continuous Supportable Load (in A) | | | | | |
|---|---|---|---|---|---|
| 1 | 1.5 | 2 | 2.5 | 3 | 3.5 |
| 0.1 | 0.13 | 0.18 | 0.22 | 0.29 | 0.32 |
| 0.19 | 0.26 | 0.35 | 0.44 | 0.59 | 0.63 |
| 0.29 | 0.39 | 0.53 | 0.66 | 0.88 | 0.95 |
| 0.44 | 0.64 | 0.88 | 1.1 | 1.33 | 1.56 |
| 0.55 | 0.73 | 1 | 1.25 | 1.67 | 1.79 |
| 0.73 | 0.97 | 1.33 | 1.67 | 2.22 | 2.38 |
| 0.97 | 1.29 | 1.77 | 2.21 | 2.94 | 3.15 |
| 0.15 | 0.23 | 0.31 | 0.38 | 0.46 | 0.53 |
| 0.31 | 0.46 | 0.61 | 0.76 | 0.92 | 1.07 |
| 0.46 | 0.64 | 0.88 | 1.1 | 1.38 | 1.58 |
| 0.71 | 0.97 | 1.33 | 1.67 | 2.12 | 2.38 |
| 0.97 | 1.29 | 1.77 | 2.21 | 2.94 | 3.15 |
| 1.21 | 1.61 | 2.21 | 2.76 | 3.68 | 3.94 |
| 0.12 | 0.18 | 0.24 | 0.29 | 0.35 | 0.41 |
| 0.18 | 0.24 | 0.33 | 0.42 | 0.53 | 0.6 |
| 0.35 | 0.49 | 0.67 | 0.83 | 1.06 | 1.19 |
| 0.53 | 0.73 | 1 | 1.25 | 1.59 | 1.79 |
| 0.71 | 0.97 | 1.33 | 1.66 | 2.12 | 2.37 |
| 0.88 | 1.29 | 1.77 | 2.21 | 2.65 | 3.09 |
| 1.06 | 1.59 | 2.12 | 2.65 | 3.18 | 3.71 |
| 1 | 1.5 | 2 | 2.5 | 3 | 3.5 |
| 0.1 | 0.15 | 0.2 | 0.24 | 0.33 | 0.36 |
| 0.21 | 0.3 | 0.4 | 0.49 | 0.65 | 0.72 |
| 0.28 | 0.41 | 0.54 | 0.66 | 0.88 | 0.98 |
| 0.42 | 0.62 | 0.82 | 0.99 | 1.33 | 1.47 |
| 0.7 | 1.03 | 1.36 | 1.66 | 2.21 | 2.45 |
| 0.8 | 1.17 | 1.54 | 1.88 | 2.5 | 2.78 |
| 1.06 | 1.56 | 2.05 | 2.5 | 3.33 | 3.7 |
| 0.14 | 0.21 | 0.27 | 0.33 | 0.44 | 0.49 |
| 0.33 | 0.5 | 0.67 | 0.83 | 1 | 1.17 |
| 0.5 | 0.75 | 1 | 1.25 | 1.5 | 1.75 |
| 0.7 | 1.03 | 1.36 | 1.66 | 2.21 | 2.45 |

FIG. 10B

| nps) by Insolation Value | | | | |
|---|---|---|---|---|
| 4 | 4.5 | 5 | 5.5 | 6 |
| 0.37 | 0.4 | 0.44 | 0.49 | 0.55 |
| 0.74 | 0.8 | 0.88 | 0.98 | 1.1 |
| 1.1 | 1.2 | 1.33 | 1.47 | 1.66 |
| 1.78 | 2 | 2.21 | 2.44 | 2.67 |
| 2.08 | 2.27 | 2.5 | 2.78 | 3.13 |
| 2.78 | 3.03 | 3.33 | 3.7 | 4.17 |
| 3.68 | 4.02 | 4.42 | 4.91 | 5.52 |
| 0.61 | 0.69 | 0.76 | 0.84 | 0.92 |
| 1.22 | 1.38 | 1.53 | 1.68 | 1.83 |
| 1.83 | 2.01 | 2.21 | 2.45 | 2.75 |
| 2.78 | 3.03 | 3.33 | 3.7 | 4.17 |
| 3.68 | 4.02 | 4.42 | 4.91 | 5.52 |
| 4.6 | 5.02 | 5.52 | 6.13 | 6.9 |
| 0.47 | 0.53 | 0.59 | 0.65 | 0.71 |
| 0.69 | 0.76 | 0.83 | 0.93 | 1.04 |
| 1.39 | 1.52 | 1.67 | 1.85 | 2.08 |
| 2.08 | 2.27 | 2.5 | 2.78 | 3.13 |
| 2.76 | 3.01 | 3.31 | 3.68 | 4.14 |
| 3.53 | 3.97 | 4.42 | 4.86 | 5.3 |
| 4.24 | 4.77 | 5.3 | 5.83 | 6.36 |
| 4 | 4.5 | 5 | 5.5 | 6 |
| 0.41 | 0.46 | 0.54 | 0.54 | 0.65 |
| 0.81 | 0.93 | 1.08 | 1.08 | 1.3 |
| 1.1 | 1.26 | 1.47 | 1.47 | 1.77 |
| 1.66 | 1.89 | 2.21 | 2.21 | 2.65 |
| 2.76 | 3.15 | 3.68 | 3.68 | 4.42 |
| 3.13 | 3.57 | 4.17 | 4.17 | 5 |
| 4.17 | 4.76 | 5.56 | 5.56 | 6.67 |
| 0.55 | 0.63 | 0.74 | 0.74 | 0.88 |
| 1.33 | 1.5 | 1.67 | 1.83 | 2 |
| 2 | 2.25 | 2.5 | 2.75 | 3 |
| 2.76 | 3.15 | 3.68 | 3.68 | 4.42 |

| | SPS Model Number | Type | Voltage | PV Watts | Ah |
|---|---|---|---|---|---|
| S | SPS24-990/795M | MPPT | 24 | 990 | 795 |
| | SPS24-1320/1060M | MPPT | 24 | 1320 | 1060 |
| | SPS48-220/106M | MPPT | 48 | 220 | 106 |
| | SPS48-330/170M | MPPT | 48 | 330 | 170 |
| | SPS48-660/265M | MPPT | 48 | 660 | 265 |
| | SPS48-990/400M | MPPT | 48 | 990 | 400 |
| | SPS48-1320/530M | MPPT | 48 | 1320 | 530 |
| | SPS48-1650/795M | MPPT | 48 | 1650 | 795 |
| | SPS48-1980/1060M | MPPT | 48 | 1980 | 1060 |
| | SPS Model Number | Type | Voltage | PV Watts | Ah |
| Economy | SPS12-55/52 | PWM | 12 | 55 | 52 |
| | SPS12-110/106 | PWM | 12 | 110 | 106 |
| | SPS12-165/156 | PWM | 12 | 165 | 156 |
| | SPS12-240/212 | PWM | 12 | 240 | 212 |
| | SPS12-320/318M | MPPT | 12 | 320 | 318 |
| | SPS12-390/340M | MPPT | 12 | 390 | 340 |
| | SPS12-480/424M | MPPT | 12 | 480 | 424 |
| | SPS24-165/78 | PWM | 24 | 165 | 78 |
| | SPS24-330/158 | PWM | 24 | 330 | 158 |
| | SPS24-495/212 | PWM | 24 | 495 | 212 |
| | SPS24-660/318M | MPPT | 24 | 660 | 318 |
| | SPS24-990/400M | MPPT | 24 | 990 | 400 |
| | SPS24-1320/600M | MPPT | 24 | 1320 | 600 |
| | SPS48-220/52M | MPPT | 48 | 220 | 52 |
| | SPS48-330/78M | MPPT | 48 | 330 | 78 |
| | SPS48-660/170M | MPPT | 48 | 660 | 170 |
| | SPS48-990/265M | MPPT | 48 | 990 | 265 |
| | SPS48-1320/340M | MPPT | 48 | 1320 | 340 |
| | SPS48-1650/400M | MPPT | 48 | 1650 | 400 |
| | SPS48-1980/530M | MPPT | 48 | 1980 | 530 |

TO FIG. 10E

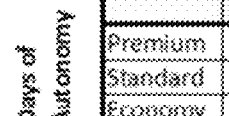

FIG. 10D

| | TO FIG. 10B | | | | |
|---|---|---|---|---|---|
| 1.05 | 1.55 | 2.04 | 2.48 | 3.31 | 3.68 |
| 1.41 | 2.06 | 2.72 | 3.31 | 4.42 | 4.91 |
| 0.13 | 0.19 | 0.26 | 0.32 | 0.39 | 0.45 |
| 0.19 | 0.29 | 0.39 | 0.48 | 0.58 | 0.67 |
| 0.35 | 0.52 | 0.68 | 0.83 | 1.1 | 1.23 |
| 0.53 | 0.78 | 1.03 | 1.25 | 1.67 | 1.85 |
| 0.7 | 1.03 | 1.36 | 1.66 | 2.21 | 2.45 |
| 0.96 | 1.45 | 1.93 | 2.41 | 2.89 | 3.37 |
| 1.16 | 1.73 | 2.31 | 2.89 | 3.47 | 4.05 |
| 1 | 1.5 | 2 | 2.5 | 3 | 3.5 |
| 0.12 | 0.18 | 0.24 | 0.31 | 0.37 | 0.43 |
| 0.24 | 0.37 | 0.49 | 0.61 | 0.73 | 0.86 |
| 0.36 | 0.53 | 0.71 | 0.89 | 1.07 | 1.24 |
| 0.53 | 0.77 | 1.01 | 1.33 | 1.6 | 1.77 |
| 0.82 | 1.16 | 1.51 | 1.99 | 2.47 | 2.65 |
| 0.9 | 1.24 | 1.62 | 2.13 | 2.83 | 2.83 |
| 1.12 | 1.55 | 2.02 | 2.65 | 3.53 | 3.53 |
| 0.18 | 0.28 | 0.37 | 0.46 | 0.55 | 0.64 |
| 0.37 | 0.55 | 0.73 | 0.92 | 1.1 | 1.28 |
| 0.55 | 0.77 | 1.01 | 1.33 | 1.65 | 1.77 |
| 0.84 | 1.16 | 1.51 | 1.99 | 2.54 | 2.65 |
| 1.06 | 1.46 | 1.9 | 2.5 | 3.33 | 3.33 |
| 1.59 | 2.19 | 2.86 | 3.75 | 5 | 5 |
| 0.14 | 0.19 | 0.25 | 0.33 | 0.42 | 0.43 |
| 0.21 | 0.28 | 0.37 | 0.49 | 0.64 | 0.65 |
| 0.42 | 0.62 | 0.81 | 1.06 | 1.27 | 1.42 |
| 0.64 | 0.95 | 1.26 | 1.59 | 1.91 | 2.21 |
| 0.85 | 1.24 | 1.62 | 2.12 | 2.54 | 2.83 |
| 1.06 | 1.46 | 1.9 | 2.5 | 3.18 | 3.33 |
| 1.27 | 1.91 | 2.52 | 3.18 | 3.82 | 4.42 |
| 1 | 1.5 | 2 | 2.5 | 3 | 3.5 |
| 32 | 24 | 20 | 18 | 15 | 14 |
| 22 | 15 | 13 | 12 | 10 | 9 |
| 11 | 8 | 7 | 6 | 5 | 5 |

| | | | | |
|---|---|---|---|---|
| 4.14 | 4.73 | 5.52 | 5.52 | 6.63 |
| 5.52 | 6.31 | 7.36 | 7.36 | 8.83 |
| 0.51 | 0.58 | 0.64 | 0.71 | 0.77 |
| 0.77 | 0.87 | 0.96 | 1.06 | 1.16 |
| 1.38 | 1.58 | 1.84 | 1.84 | 2.21 |
| 2.08 | 2.38 | 2.78 | 2.78 | 3.33 |
| 2.76 | 3.15 | 3.68 | 3.68 | 4.42 |
| 3.85 | 4.34 | 4.82 | 5.3 | 5.78 |
| 4.63 | 5.2 | 5.78 | 6.36 | 6.94 |
| 4 | 4.5 | 5 | 5.5 | 6 |
| 0.43 | 0.54 | 0.54 | 0.67 | 0.72 |
| 0.88 | 1.1 | 1.1 | 1.34 | 1.47 |
| 1.3 | 1.6 | 1.63 | 1.96 | 2.13 |
| 1.77 | 2.21 | 2.21 | 2.93 | 2.94 |
| 2.65 | 3.31 | 3.31 | 4.42 | 4.42 |
| 2.83 | 3.54 | 3.54 | 4.72 | 4.72 |
| 3.53 | 4.42 | 4.42 | 5.89 | 5.89 |
| 0.65 | 0.81 | 0.81 | 1.01 | 1.08 |
| 1.32 | 1.65 | 1.65 | 2.02 | 2.19 |
| 1.77 | 2.21 | 2.21 | 2.94 | 2.94 |
| 2.65 | 3.31 | 3.31 | 4.42 | 4.42 |
| 3.33 | 4.17 | 4.17 | 5.56 | 5.56 |
| 5 | 6.25 | 6.25 | 8.33 | 8.33 |
| 0.43 | 0.54 | 0.54 | 0.72 | 0.72 |
| 0.65 | 0.81 | 0.81 | 1.08 | 1.08 |
| 1.42 | 1.77 | 1.77 | 2.33 | 2.36 |
| 2.21 | 2.76 | 2.76 | 3.5 | 3.68 |
| 2.83 | 3.54 | 3.54 | 4.66 | 4.72 |
| 3.33 | 4.17 | 4.17 | 5.56 | 5.56 |
| 4.42 | 5.52 | 5.52 | 7 | 7.36 |
| 4 | 4.5 | 5 | 5.5 | 6 |
| 12 | 11 | 10 | 9 | 8 |
| 8 | 7 | 6 | 6 | 5 |
| 5 | 4 | 4 | 3 | 3 |

SYSTEMS AND METHODS FOR SOLAR POWER EQUIPMENT

RELATED APPLICATIONS

This application claims benefit of U.S. Provisional Patent Application Ser. No. 61/547,727, filed Oct. 16, 2011.

The contents of all applications listed above are incorporated herein by reference.

TECHNICAL FIELD

The present invention relates to systems and methods for designing solar power equipment and, more particularly, to computerized systems for designing solar power equipment customized for a particular use and location.

BACKGROUND

Solar power equipment must be specified to meet certain load requirements and to operate within given parameters in a particular location. The need exists to automate the process of specifying or designing solar power equipment.

SUMMARY

The present invention may be embodied as a design system for generating a power equipment proposal for a particular location, comprising an insolation database, a load database, and a processing system. The insolation database comprises insolation values associated with a plurality of geographic data points. The load database associates appropriate power equipment with load requirements. The processing system generates at least one power equipment proposal based on load requirements generated from the insolation database based on the insolation values associated with a geographic data point closest to the particular location and solar power equipment appropriately selected from the load database based on the load requirements generated from the insolation database.

The present invention may also be embodied as a method of generating a power equipment proposal for a particular location comprising the following steps. An insolation database is provided that comprises insolation values associated with a plurality of geographic data points. A load database is provided that associates appropriate solar power equipment with load requirements. A geographic data point closest to the particular location is selected. Load requirements are generated from the insolation database based on the insolation values associated with the selected geographic data point. A list of power equipment appropriate for the load requirements is generated from the load database. At least one power equipment proposal is generated based on the load requirements generated from the insolation database and the list of power equipment generated from the load database.

The present invention may further be embodied as a design system for generating a power equipment proposal for a particular location comprising a user interface, an insolation database, a load database, and a processing system. The user interface allows entry of system specifications. The insolation database comprises insolation values associated with a plurality of geographic data points. The load database associates appropriate power equipment with load requirements. The processing system for generating a plurality of power equipment proposals based on load requirements generated from the insolation database based on the insolation values associated with a geographic data point closest to the particular location, solar power equipment selected from the load database based on the load requirements generated from the insolation database, and the system specifications.

BRIEF DESCRIPTION OF THE DRAWINGS

FIG. 4A depicts a second data input pane' displayed by the first example user interface in a first configuration;

FIG. 4B depicts the second data input panel in a second configuration;

FIG. 5 depicts a third data input panel displayed by the first example user interface:

FIG. 6 depicts a fourth data input panel displayed by the first example user interface;

FIG. 7 depicts a fifth data input panel displayed by the first example user interface;

FIGS. 9A and 9B are an example representation of a raw data table containing insolation data collected for Seattle, Wash. (47N, 123W); and FIGS. 10A, 10B, 10C, 10D, 10E, and 10F are an example of a Load Table containing load data calculated for a plurality of solar systems.

DETAILED DESCRIPTION

Figure 1:
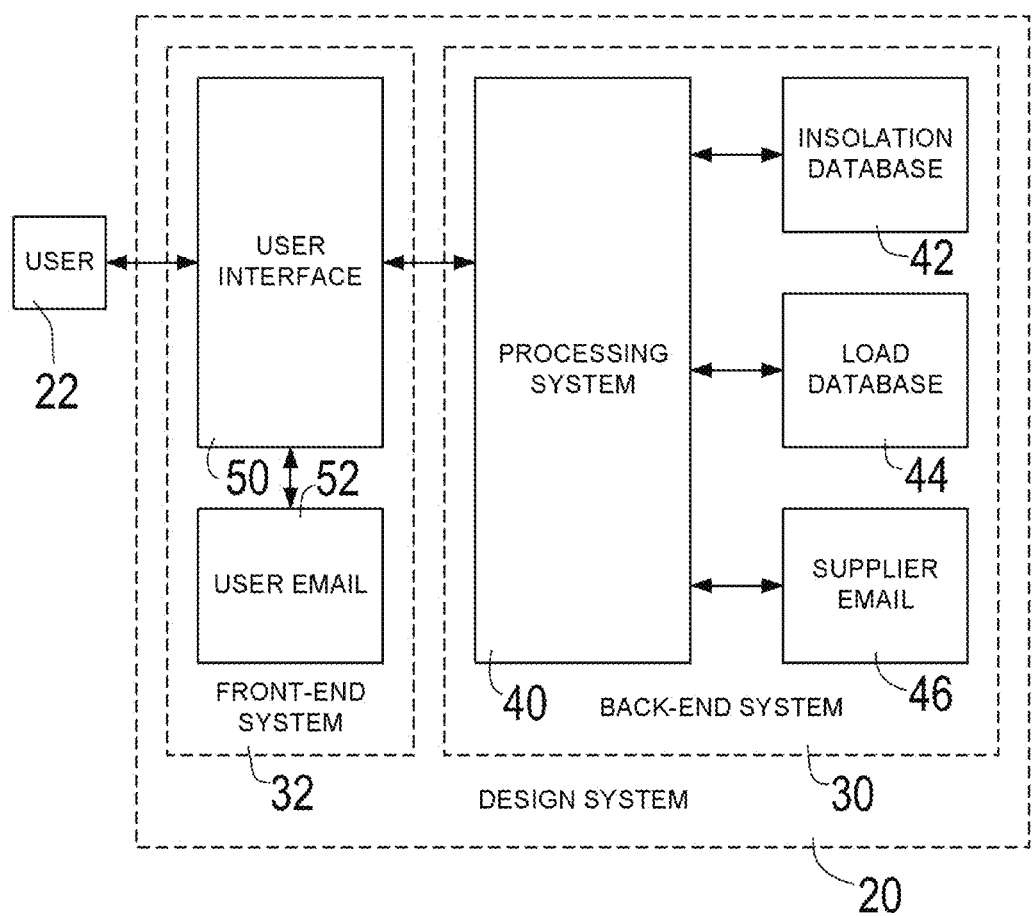
FIG. 1 is a block diagram of a first example design system or designing solar power equipment of the present invention.

Referring initially to FIG. 1 of the drawing, depicted therein is a first example design system 20 for allowing a user 22 to generate a solar power equipment design. The example design system 20 comprises a back-end system 30 and a front-end system 32. The example back-end system 30 comprises a processing system 40, an insolation database 42, a load database 44, and, optionally, a supplier email system 46. The example front-end system 32 is capable of generating a user interface 50 and optionally contains a user email system 52.

The back-end system 30 and the front-end system 32 may be implemented entirely on a single computer or may be distributed across a plurality of computers connected by a network (not shown). If used, the network may be a local area network or may be a distributed network such as the Internet. The network may be wired or wireless.

The back-end system 30 may be implemented as a database server application capable of storing data and performing calculations based on stored data and data collected by the front-end system 32. In this case, the front-end system 32 will be typically be implemented as a remote computer running a standalone software application capable of generating the user interface 50 and transmitting data to the back-end system 30. Alternatively, the back-end system 30 may be implemented as a web server capable of storing data, generating the user interface 50, and performing calculations based on stored data and data collected through the user interface 50. In this case, the front-end system 32 will typically be implemented as what is commonly referred to as a "thin client" or browser capable of running the user interface 50 as generated by the back-end system 30. And as generally discussed above, both the back-end system 20 and the front-end system 20 may be implemented as a software application running on a single computing device.

One or more parts of the first example design system 20 will typically include or be embodied as one or more applications running an operating system such as Microsoft Windows, Unix, and/or Apple OS X. Such operating systems typically run on a computing system such as a workstation, a server, a personal computer, and/or a laptop computer. Alternatively, one or more parts of the first example design system may include or be embodied as an application running on a personal digital assistant (PDA), tablet, or cell-phone-based computing device running an operating system such as Apple iOS or Google Android.

The insolation data stored in the insolation database 42 is or may be calculated from publicly available databases such as data published by the NASA Langly Research Center Atmospheric Science Data Center POWER Project (the NASA SSE database). The NASA SSE database contains raw insolation data for geographic data points corresponding to each 1° of latitude and longitude in the United States (including Alaska and Hawaii). The example insolation database 42 was generated by calculating for each data point in the NASA SSE database minimum and average Insolation over a 22-year period. These minimum and average insolation values are stored for each data point in the example insolation database 42.

Figure 9A:

More specifically, the example insolation data stored in the insolation database was calculated as follows. First, data is obtained from the NASA LARC data online website (http://eosweb.larc.nasa.gov/cgi-bin/sse/grid.cgi?email=) by navigating to the page where the latitude and longitude of a particular geographical site can be entered. This will require entry of an email address and password or, if you are new to the website, you may be required to create a new account. The correct lat/long (taken from Google Maps in the User Input portion) is then entered, and the website displays a page with many categories and their corresponding list boxes. Find the category "Parameters for Tilted Solar Panels" and select both "Radiation on equator-pointed tilted surfaces" and Minimum radiation for equator-pointed tilted surfaces" from the list box on the right. To highlight multiple selections from a list box, press and hold Ctrl while clicking on each selection. Press "Submit" at the bottom of the page. The website now displays a page containing two tables. The insolation data is derived from one row from each table. In particular, the insolation data is derived from the row that corresponds to the tilt angle of the entered latitude plus 15°. For example, if you enter "48" for latitude, you are interested in the row identified as "Tilt 63". This row will always be the fourth from the bottom. An example of a representation of a raw data table containing insolation data collected for Seattle, Wash. (47N, 123W) is shown in FIGS. 9A and 9B.

As will be described in further detail below, the average radiation value is used for Standard and Economy systems, while the minimum radiation value is used for Premium systems. The solar panel industry uses the term "insolation" to refer to substantially the same physical phenomena referred to in the tables as "radiation".

The example load database 44 contains data associated with a plurality of configurations of battery banks, photovoltaic (PV) panel array modules, and voltages. The load that a given battery bank could provide less certain predetermined system losses was calculated. The load that a given PV panel array could support less certain predetermined system losses was calculated for each solar resource. The smaller of these two load values corresponded to the minimum that a given system comprising a particular combination of battery bank and PV panel array could support. This process was repeated for each available voltage (e.g., 12V DC, 24V DC, 48V DC). The load data is calculated for a plurality of predetermined systems having different combinations of battery bank and PV panel array to provide an incremental increase in supportable loads.

An example of a Load Table containing load data calculated for a plurality of solar systems (e.g., combinations of battery banks and PV arrays) falling into Standard, Economy, and Premium categories is shown in FIGS. 10A-10F. Because of page size limitations, the example Load Table is broken into six sections, with the upper left section of the Load Table shown in FIG. 10A, the upper middle section of the Load Table shown in FIG. 10B, the upper right section of the Load Table shown in FIG. 10C, the lower left section of the Load Table shown in FIG. 10D, the lower middle section of the Load Table shown in FIG. 10E, and the lower right section of the Load Table shown in FIG. 10F.

Figure 2:
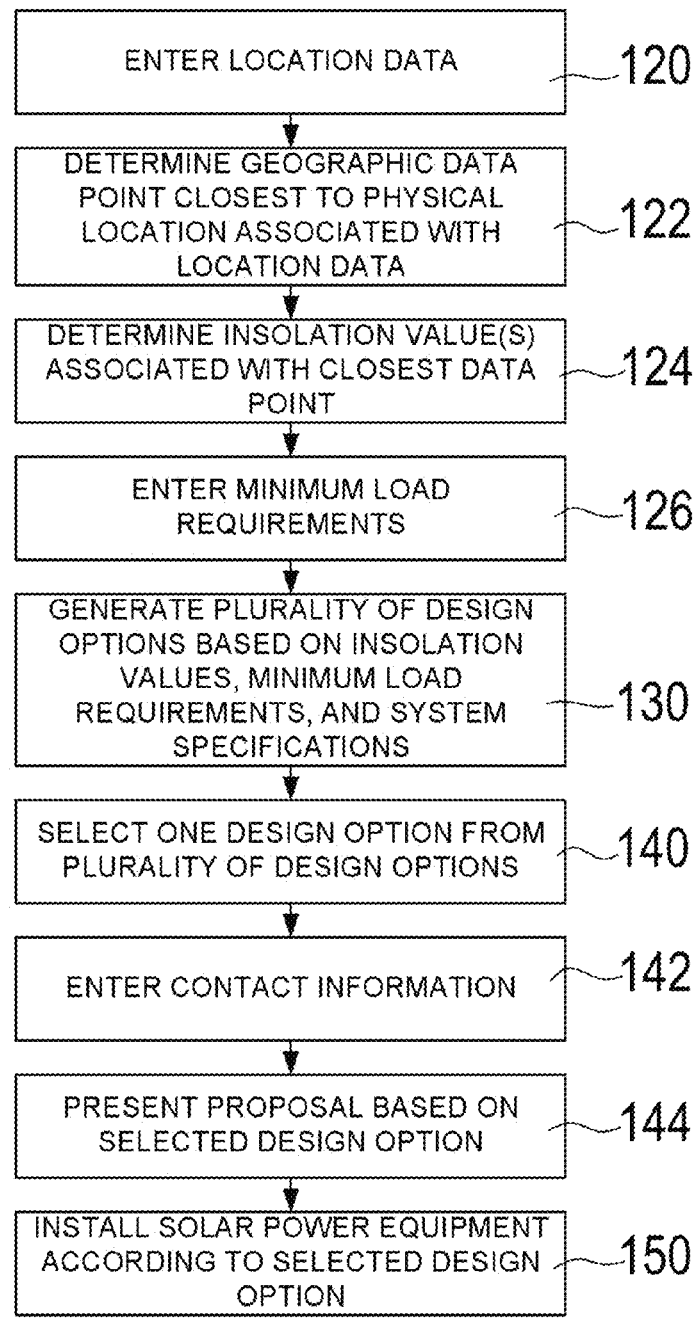
FIG. 2 is a flow chart depicting the logic flow of a first example design method that may be implemented by the first example design system.

Referring now to FIG. 2 of the drawing, one example method of using the first example design system 20 will now be described. Initially, using the user interface 50, the user enters location data at step 120. Based on the location data entered at step 120, the processing system 40 determines at step 122 the nearest geographic data point associated with the location data. At step 124, the processing system 40 determines from the insolation data stored in the insolation database 42 one or more insolation values associated with a physical location associated with the location data. As described above, the example processing system 40 will typically determine at least average insolation and minimum insolation for the physical location associated with the location data. The insolation value(s) associated with the location data are temporarily stored for later use as will be described in further detail below.

At step 126 in FIG. 2, the user enters minimum load requirements based on the specifications of the equipment to be powered by the solar power equipment to be located at the facility associated with the location data entered at step 120.

At step 130 in FIG. 2, the processing system 40 determines, based on the insolation value(s) associated with the location data as determined at step 124 and the minimum bad requirements entered at step 126, a plurality of design options. In particular, using pre-calculated bad tables, the processing system 40 selects the systems that will support the specified bad, one system from each category in the table: Premium, Standard, and Economy. For each category, the processing selects the appropriate systems from each category by first finding the correct column (based on insolation) and then finding the correct row (based on system voltage and supportable bad). Each row in the table represents one system. Each of the plurality of design options differs from the other in at bast the "days of autonomy" associated with the design options. The term "days of autonomy" generally refers the length of time in days that a given system can be expected to operate, under a predetermined worst case scenario, at a particular facility given the bad represented by the equipment at that facility and the average and/or minimum Insolation level at the facility given the geographic location of the facility.

At step 140 in FIG. 2, the user selects one of the plurality of design options as a desired design. At step 142, the user enters the user's contact information. The supplier of the solar power equipment then generates a proposal based on the selected design option (i.e., the desired design) and presents the proposal to the user using the contact information at step 144. The optional email systems 46 and 52 may be used to communicate during the process of presenting and accepting the proposal. After the proposal has been accepted by the user, the solar power equipment is installed at step 150.

Figure 3:
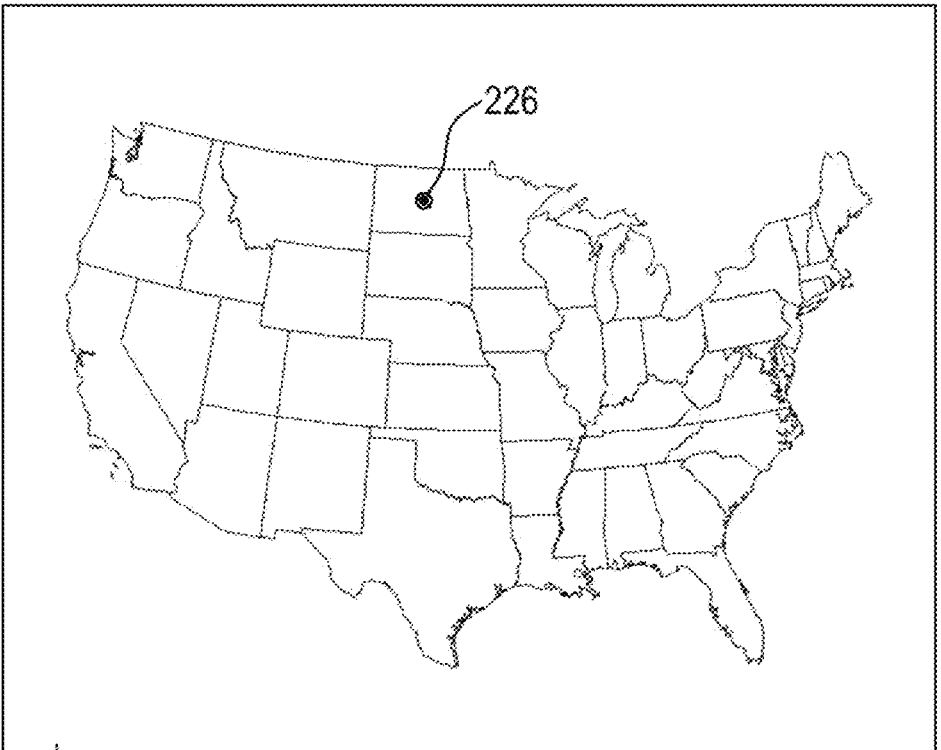
FIG. 3 depicts a first data input panel displayed by a first example user interface that may be generated by the first example design system.

Referring now to FIGS. 3-7 of the drawing, an example user interface that may be created by the example design system 20 will now be described. FIG. 3 depicts a location panel containing a LOCATION field 220, an optional PROJECT NAME field 222, and a map area 224. Optionally, the user first enters a project name (e.g., "Security System") into the PROJECT NAME field 222. The user next enters location data by typing the name of a city and state into the LOCATION field 220 or clicking on a location in the map area 224. As is conventional, the map area may be configured to zoom in and/or out to facilitate the identification of a specific location. A pin or other indicator 226 may be displayed in the map area 226 after the user has clicked on that location of the map area and/or entered a city and state. When the location data has been entered to the satisfaction of the user, the user presses a NEXT button 228.

Referring now to FIG. 4A of the drawing, depicted therein is a first configuration of a load panel containing a load description input field 230a, a load quantity input field 232a, a load Watts input field 234a, a load Hours/Day input field 236a, and a load Wh/Day input field 238a. The load panel further comprises a System Voltage dropdown selection box 240, and an ADD button 242. The example load panel further comprises a Total Daily Power Consumption display field 250, a Maximum Hourly Power Consumption display field 252, an Average Power Consumption display field 254, a System Load display field 256, and a NEXT button 258.

The user enters a description of each load in the Description field 230a (e.g., "Camera"), a quantity in the load Quantity field 232a (e.g., "2"), a power value in Watts in the load Watts field 234a (e.g., "10"), the number of hours in the day the load is expected to operate in the load Hours/Day field 236a (e.g., "24"), and a watt-hour per day value in the load Wh/Day field 238a (e.g., "480"). The user then identifies a voltage associated with the load by selecting one value (e.g., "12 V DC") from a plurality of voltages (e.g., "12 V DC", "24 V DC", and "48 V DC") in the System Voltage dropdown box 240. As depicted in FIGS. 3-7, the example interface only allows the creation of designs using only a single system voltage. In the future, however, the system may be designed to accommodate loads of different operating voltages, in which case each load will be associated with one of the plurality of voltages.

The display fields 250-256 indicate running totals generated for each of defined values based on the load values input in using the input fields 230-238. The user cannot alter or enter data in the display fields 250-256.

Commonly, a given project requires that multiple loads be powered. In this case, the user may click the ADD button 242, and a second configuration of the load panel is generated as depicted in FIG. 4B. The second configuration of the load panel further comprises a load description input field 230b, a load quantity input field 232b, a load Watts input field 234b, a load Hours/Day input field 236b, and a load Wh/Day input field 238b to allow the user to define a second load. By clicking the ADD button 242 after entering data associated with each load, the user is presented with multiple rows of entry fields like the fields 230a-238a and 230b-238b. The display fields 250-256 indicate running totals generated for each of defined values based on the load values input in using the input fields 230a-238a and 230b-238b, and any additional input fields displayed after clicking on the ADD button 242. After the user has entered all loads as described above, the user clicks on the NEXT button 258.

At this point, the user is presented with a select solution panel as depicted in FIG. 5. The select solution panel comprises a location overview area 260, a Premium solution area 262, a Standard solution area 264, an Economy solution area 266, and a NEXT button 268. The location overview area contains a nearest city display field 270, an average insolation display field 272 displaying an average insolation value associated with the nearest city, and a minimum insolation field 274 displaying a minimum insolation value associated with the nearest city.

The Premium, Standard, and Economy areas 262, 264, and 266 all contain the same information for each of three different solutions. Each of these areas 262, 264, and 266 contains a System display fields 280a, 280b, and 280c, a Days of Autonomy display field 282a, 282b, and 282c, a Voltage display field 284a, 284b, and 284c, a PV Array Size field 286a, 286b, and 286c, a Battery Bank Size display field 288a, 288b, and 288c, a PWM or MPPT display field 290a, 290b, and 290c, and a Warranty display field 292a, 292b, and 292c. The values and/or data displayed in these display fields is determined by the characteristics of the system defined in the System display fields and cannot be altered by the user. In the example depicted in FIG. 5, the user may, however, select anywhere in one of the three areas 262, 264, and/or 266 to select one of the three systems specified in these areas. Alternatively, the interface may be configured to allow the user to select and/or rank two or more of the systems defined in the areas 262, 264, and/or 266. After the user selects one of the area 262, 264, or 266 to identify a selected one of the design solutions, the user clicks on the NEXT button 268 to accept the system associated with the currently selected area 262, 264, or 266.

Referring now to FIG. 6 of the drawing, depicted therein is a contact information panel for allowing the user to enter contact information to establish contact with the supplier operating the design system 20. The example contact information panel comprises a SOLUTION display field 320 displaying the selected design solution, a NAME entry field 322, a COMPANY entry field 324, one or more ADDRESS entry fields 326, a CITY entry field 328, a STATE entry field 330, a ZIP CODE entry field 332, an EMAIL entry field 334, a PHONE entry field 336, and a NEXT button 338. The user enters the pertinent contact information in a conventional manner and then clicks on the NEXT button 338.

The interface then presents a questions/comments panel as depicted in FIG. 7. The questions/comments panels comprises a QUESTIONS/COMMENTS data entry field 340 to allow the user to type in specific requests and/or questions not handled in the predetermined data entry fields described above. After entering any relevant information in the QUESTIONS/COMMENTS data entry field 340, the user clicks a SUBMIT button 342 to submit the entered load data for generation of a proposal as generally discussed above.

Figure 8:
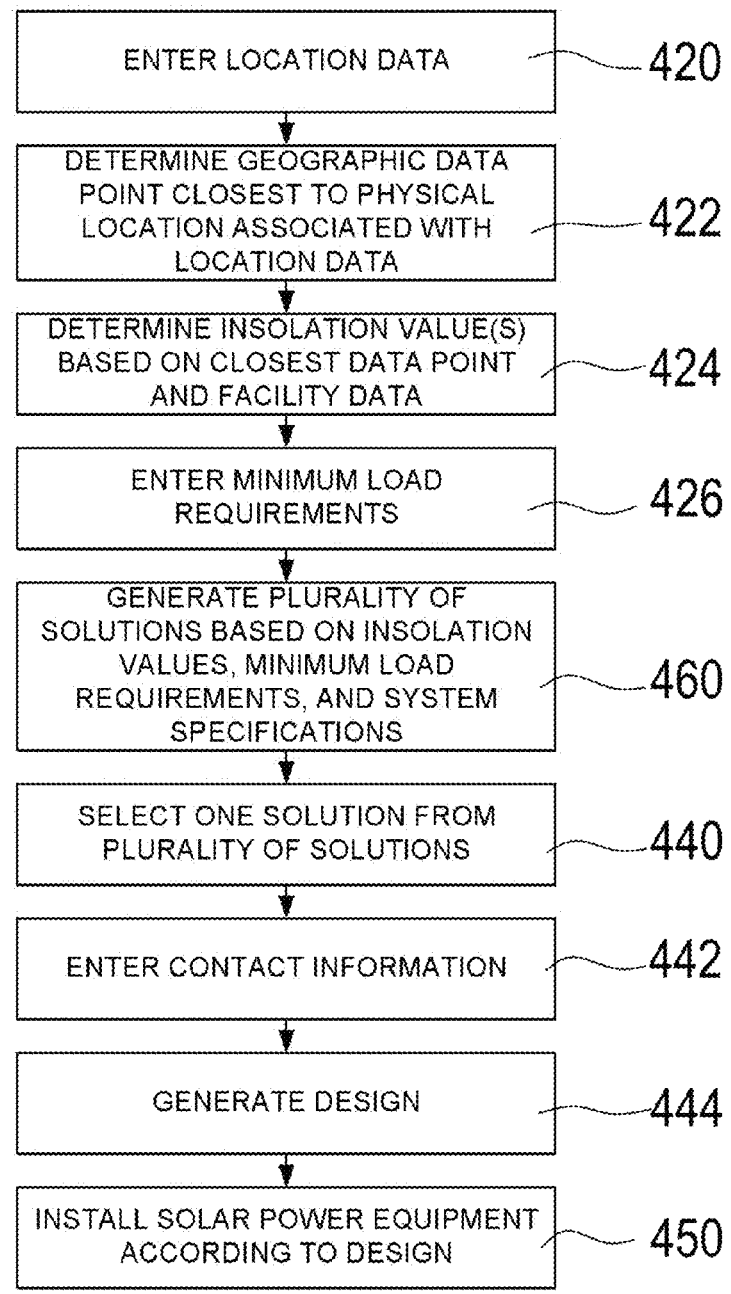
FIG. 8 is a flow chart depicting the logic flow of a second example design method that may be implemented by the first example design system.

Referring now to FIG. 8 of the drawing, a second example method of using the first example design system 20 will now be described. Modern computing devices commonly include additional facilities such as a camera and a global positioning system (GPS). It is also possible for such modern computing devices to contain hardware and software capable of determining a direction in which the device is pointed and/or angle of incidence of the device with respect to horizontal. Accordingly, the second example method depicted in FIG. 8 is configured to use additional facility data generated by such computing devices when calculating insolation value(s).

Like the first example method described above with respect to FIG. 2, the user of the second example method enters location data at step 420. This location data can be entered manually as described above with respect to FIG. 3 or, alternatively, by using a GPS system contained in the computing device. Additionally, the user can use a camera feature of the computing device, if available, to generate one or more images representing the view{s} of the sky from the possible location or locations where the solar PV array may be placed. The GPS system can further measure the direction and/or angle at which the solar PV array may be positioned to generate additional data about the possible locations or locations of the PV solar arrays. The image data, position, and angle data can be aggregated as facility data that can further be used to determine the efficacy of the PV solar array as installed at a particular facility.

Based on the location data entered at step 420, the processing system 40 determines at step 422 the nearest geographic data point associated with the location data. At step 424, the processing system 40 determines from the nearest geographic data point, the insolation data stored in the insolation database 42, and the facility data (e.g., image data, direction data, and/or angle data) one or more insolation values associated with a physical location associated with the location data. As described above, the example processing system 40 will typically determine at least average insolation and minimum insolation for the physical location associated with the location data. The insolation value(s) associated with the location data are temporarily stored for later use as will be described in further detail below.

At step 426 in FIG. 8, the user enters minimum load requirements based on the specifications of the equipment to be powered by the solar power equipment to be located at the facility associated with the location data entered at step 420.

At step 430 in FIG. 8, the processing system 40 determines, based on the insolation value(s) associated with the location data as determined at step 424 and the minimum load requirements entered at step 426, a plurality of design options. Each of the plurality of design options differs from the other in at least the "days of autonomy" associated with the design options. The term "days of autonomy" generally refers the length of time in days that a given system can be expected operate at a particular facility given the load represented by the equipment at that facility and the average and/or minimum insolation level at the facility given the geographic location of the facility.

At step 440 in FIG. 8, the user selects one of the plurality of design options as a desired design. At step 442, the user enters the user's contact information. The supplier of the solar power equipment then generates a proposal based on the selected design option (i.e., the desired design) and presents the proposal to the user using the contact information at step 444. The optional email systems 46 and 52 may be used to communicate during the process of presenting and accepting the proposal. After the proposal has been accepted by the user, the solar power equipment is installed at step 450.

A first example of the operation of a system incorporating the principles of the present invention can be illustrated by representing the differences among the Premium, Standard, and Economy solutions at one location for two different loads. The average and minimum insolation values for Phoenix, Ariz. are 5.08 Peak Sun-hours and 4.01 Peak Sun-hours, respectively. For a first load of 10 Watts operating at 12 Volts DC for 24 hours/day and a second load of 40 Watts operating at 12 Volts DC for 24 hours/day, the following Premium, Standard, and Economy solutions are obtained:

| First Example Comparison Table | | | | | | |
|---|---|---|---|---|---|---|
| | 10 Watts, 24 hours/day, 12 V DC | | | 40 Watts, 24 hours/day, 12 V DC | | |
| | Premium | Standard | Economy | Premium | Standard | Economy |
| Autonomy | 12 days | 6 days | 4 days | 12 days | 6 days | 4 days |
| Voltage | 12 V DC | 12 V DC | 12 V DC | 12 V DC | 12 V DC | 12 V DC |
| PV Size | 160 W | 110 W | 110 W | 480 W | 320 W | 320 W |
| Batt. Size | 318 Ah | 156 Ah | 106 Ah | 1060 Ah | 530 Ah | 318 Ah |
| Type | PWM | PWM | PWM | MPPT | MPPT | MPPT |
| Warranty | 5 year | 2 year | 1 year | 5 year | 2 year | 1 year |

A second example of the operation of a system incorporating the principles of the present invention can be illustrated by representing the differences among the Premium, Standard, and Economy solutions at two locations for the same load. The average and minimum insolation values for Phoenix, Ariz. are 5.08 Peak Sun-hours and 4.01 Peak Sun-hours, respectively, while the average and minimum insolation values for Bowdon, N. Dak. are 2.17 Peak Sun-hours and 1.73 Peak Sun-hours, respectively. For a load of 10 Watts operating at 12 Volts DC for 24 hours/day, the following Premium, Standard, and Economy solutions are obtained:

| Second Example Comparison Table | | | | | | |
|---|---|---|---|---|---|---|
| | Phoenix, Arizona | | | Bowdon, North Dakota | | |
| | Premium | Standard | Economy | Premium | Standard | Economy |
| Autonomy | 12 days | 6 days | 4 days | 24 days | 13 days | 7 days |
| Voltage | 12 V DC | 12 V DC | 12 V DC | 12 V DC | 12 V DC | 12 V DC |
| PV Size | 160 W | 110 W | 110 W | 390 W | 320 W | 180 W |
| Batt. Size | 318 Ah | 156 Ah | 106 Ah | 800 Ah | 530 Ah | 158 Ah |
| Type | PWM | PWM | PWM | MPPT | MPPT | PWM |
| Warranty | 5 year | 2 year | 1 year | 5 year | 2 year | 1 year |

The present invention may be embodied as an automated design system tool for generating a power equipment proposal for a particular location, comprised of an insolation database with insolation values associated with a plurality of geographic data points, a load database associating appropriate power equipment with load requirements including duty cycles for the equipment, and a processing system which takes into account the periods of poor weather and corresponding low insolation to generate a power equipment proposal. The power equipment proposal will thus typically include three solutions based upon the required level of system reliability or up time as defined below.

The economy level design is for non-essential loads that can tolerate periodic outages based on seasonal weather changes which result in low levels of insolation.

The standard level design uses average insolation or weather patterns and is for loads that can tolerate occasional and/or rare outages based on extreme and unusual weather changes.

The premium level design uses worst case insolation or weather patterns over at least 20 years of data and is for critical loads that cannot tolerate any outages. The premium level design is thus designed for 24-7-365 operations.

The proposal is generated based on load requirements, the insolation database based on the insolation values associated with a geographic data point closest to the particular location, the periods of poor weather and corresponding low insolation, the level of system reliability required, and solar power equipment appropriate based on the load requirements generated from the insolation database.

The present invention may also be embodied as a design system for generating a power equipment proposal for a particular location comprising a user interface, an insolation database, a load database, and a processing system. The user interface allows entry of system specifications. The insolation database comprises insolation values associated with a plurality of geographic data points. The load database associates appropriate power equipment with load requirements. The processing system for generating a plurality of power equipment proposals based on load requirements generated from the insolation database based on the insolation values associated with a geographic data point closest to the particular location, and takes into account the periods of poor weather and corresponding low insolation and selects the solar power equipment from the load database based on the load requirements generated from the insolation database, and the system specifications.

What is claimed is:

1. A design system for generating a power equipment proposal for a particular location, comprising:
   an insolation database comprising insolation values associated with a plurality of geographic data points;
   a load database associating appropriate power equipment with load requirements; and
   a processing system for generating at least one power equipment proposal based on
      load requirements generated from the insolation database based on the insolation values associated with a geographic data point closest to the particular location, and
      solar power equipment appropriately selected from the load database based on the load requirements generated from the insolation database.

2. A design system as recited in claim 1, further comprising a user interface to allow entry of system specifications, where the processing system further generates the at least one power equipment proposal based on the system specifications.

3. A design system as recited in claim 1, in which the processing system generates a plurality of power equipment proposals.

4. A design system as recited in claim 3, further comprising a user interface for allowing one of the plurality of power equipment proposals to be selected.

5. A design system as recited in claim 1, further comprising a user interface, wherein
   the user interface allows entry of system specifications;
   the processing system generates a plurality of power equipment proposals further based on the system specifications; and
   the user interface further allows one of the plurality of power equipment proposals to be selected.

6. A design system as recited in claim 1, in which:
   the insolation database contains at least first and second insolation values; and
   the processing system generates a first equipment proposal based on the first value stored in the insolation database; and
   the processing system generates a second power equipment proposal based on the second value stored in the insolation database.

7. A design system as recited in claim 6, in which:
   the first value is an average insolation value; and
   the second value is a minimum insolation value.

8. A design system as recited in claim 7, in which a first cost associated with the first power equipment proposal is less than a second cost associated with the second power equipment proposal.

9. A method of generating a power equipment proposal for a particular location, comprising:
   providing, in a processing system, an insolation database comprising insolation values associated with a plurality of geographic data points;
   providing, in the processing system, a load database associating appropriate solar power equipment with load requirements;
   selecting, using the processing system, a geographic data point closest to the particular location;
   generating, using the processing system, load requirements from the insolation database based on the insolation values associated with the selected geographic data point;
   generating, using the processing system, from the load database a list of power equipment appropriate for the load requirements; and
   generating, using the processing system, at least one power equipment proposal based on the load requirements generated from the insolation database and the list of power equipment generated from the load database.

10. A method as recited in claim 9, further comprising the steps of:
    providing a user interface for allowing entry of system specifications; and
    generating the at least one power equipment proposal further based on the system specifications.

11. A method as recited in claim 9, in which a plurality of power equipment proposals are generated.

12. A method as recited in claim 11, further comprising the steps of:
    providing a user interface; and
    selecting one of the plurality of power equipment proposals using the user interface.

13. A method as recited in claim 9, further comprising the steps of:
    providing a user interface;
    entering system specifications using the user interface;
    generating a plurality of power equipment proposals further based on the system specifications; and selecting one of the plurality of power equipment proposals using the user interlace.

14. A method as recited in claim 9, in which the insolation database contains at least first and second insolation values, the method further comprising the steps of:
   generating a first equipment proposal based on the first value stored in the insolation database; and
   generating a second power equipment proposal based on the second value stored in the insolation database.

15. A method as recited in claim 14, in which:
   the first value is an average insolation value; and
   the second value is a minimum insolation value.

16. A method as recited in claim 15, in which a first cost associated with the first power equipment proposal is less than a second cost associated with the second power equipment proposal.

17. A design system for generating a power equipment proposal for a particular location, comprising:
   a user interlace that allows entry of system specifications;
   an insolation database comprising insolation values associated with a plurality of geographic data points;
   a load database associating appropriate power equipment with load requirements; and
   a processing system for generating a plurality of power equipment proposals based on
   load requirements generated from the insolation database based on the insolation values associated with a geographic data point closest to the particular location,
   solar power equipment selected from the load database based on the load requirements generated from the insolation database, and
   the system specifications.

18. A design system as recited in claim 17, in which the user interface further allows one of the plurality of power equipment proposals to be selected.

19. A design system as recited in claim 17, in which:
   the insolation database contains at least average and minimum insolation values; and
   the processing system generates a first equipment proposal based on the average insolation value stored in the insolation database; and
   the processing system generates a second power equipment proposal based on the minimum value stored in the insolation database.

20. A design system as recited in claim 19, in which a first cost associated with the first power equipment proposal is less than a second cost associated with the second power equipment proposal.

* * * * *